US012588518B2

(12) United States Patent
Lo et al.

(10) Patent No.: US 12,588,518 B2
(45) Date of Patent: Mar. 24, 2026

(54) SEMICONDUCTOR DEVICE WITH REINFORCED DIELECTRIC AND METHOD THEREFOR

(71) Applicant: NXP B.V., Eindhoven (NL)

(72) Inventors: Tsung Nan Lo, Taoyuan City (TW);
Antonio Aguinaldo Marquez Macatangay, Sta. Rosa (PH)

(73) Assignee: NXP B.V., Eindhoven (NL)

( * ) Notice: Subject to any disclaimer, the term of this patent is extended or adjusted under 35 U.S.C. 154(b) by 719 days.

(21) Appl. No.: 17/935,613

(22) Filed: Sep. 27, 2022

(65) Prior Publication Data

US 2024/0105658 A1     Mar. 28, 2024

(51) Int. Cl.
*H01L 23/00* (2006.01)

(52) U.S. Cl.
CPC .............. *H01L 24/19* (2013.01); *H01L 24/20* (2013.01); *H01L 24/73* (2013.01); *H01L 24/13* (2013.01); *H01L 2224/13006* (2013.01); *H01L 2224/13014* (2013.01); *H01L 2224/2101* (2013.01); *H01L 2224/2105* (2013.01); *H01L 2224/211* (2013.01); *H01L 2224/214* (2013.01); *H01L 2224/215* (2013.01); *H01L 2224/24991* (2013.01); *H01L 2224/73101* (2013.01); *H01L 2924/35121* (2013.01)

(58) Field of Classification Search
CPC ...................................... H01L 24/19
See application file for complete search history.

(56) References Cited

U.S. PATENT DOCUMENTS

| | | | |
|---|---|---|---|
| 7,169,685 | B2 | 1/2007 | Connell et al. |
| 8,017,521 | B2 | 9/2011 | Do et al. |
| 9,006,891 | B2 | 4/2015 | Liang et al. |
| 10,128,179 | B2 | 11/2018 | Kim et al. |
| 2010/0078772 | A1 | 4/2010 | Robinson |
| 2014/0045326 | A1 * | 2/2014 | Liang ...................... H01L 24/11 |
| | | | 438/612 |

OTHER PUBLICATIONS

U.S. Appl. No. 17/239,888, filed Apr. 26, 2021, entitled "Semiconductor Device Under Bump Structure and Method Therefor".

* cited by examiner

*Primary Examiner* — William A Harriston

(57) ABSTRACT

A method of manufacturing a semiconductor device is provided. The method includes forming a redistribution layer (RDL) over a semiconductor die, a portion of the RDL contacting a die pad of the semiconductor die. A non-conductive layer is formed over the RDL. An opening in the non-conductive layer is formed exposing a portion of the RDL. A plurality of plateau regions is formed in the non-conductive layer. A cavity region in the non-conductive layer separates each plateau region of the plurality of plateau regions. A metal layer is deposited over the non-conductive layer and exposed portion of the RDL and etched to expose the plurality of plateau regions through the metal layer. The cavity region remains substantially filled by a portion of the metal layer.

20 Claims, 10 Drawing Sheets

SEMICONDUCTOR DEVICE WITH REINFORCED DIELECTRIC AND METHOD THEREFOR

BACKGROUND

Field

This disclosure relates generally to semiconductor device packaging, and more specifically, to a semiconductor device with reinforced dielectric and method of forming the same.

Related Art

Today, there is an increasing trend to include sophisticated semiconductor devices in products and systems that are used every day. These sophisticated semiconductor devices may include features for specific applications which may impact the configuration of the semiconductor device packages, for example. For some features and applications, the configuration of the semiconductor device packages may be susceptible to lower reliability, lower performance, and higher product or system costs. Accordingly, significant challenges exist in accommodating these features and applications while minimizing the impact on semiconductor devices' reliability, performance, and costs.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Generally, there is provided, semiconductor device packaging with a reinforced dielectric structure. The semiconductor device packaging includes a redistribution layer formed over a semiconductor die and connected to die pads of the semiconductor die. A dielectric layer (e.g., top nonconductive layer) is formed over the redistribution layer. A plurality of openings is formed in the dielectric layer to expose respective portions of the underlying redistribution layer. The openings in the dielectric layer and corresponding exposed portions of the redistribution layer are configured for under-bump metallization structures formed at a subsequent stage of manufacturing. A shallow-etched cavity region is etched into a top surface of the dielectric layer such that a plurality of plateau regions of the dielectric layer are formed. Each plateau region of the plurality of the plateau regions is separated from one another by way of the cavity region. A metal layer is formed over the dielectric layer and exposed portions of the redistribution layer. Exposed portions of the metal layer are etched at a subsequent stage of manufacturing to expose top surfaces of the plurality of plateau regions. In this manner, the etched metal layer provides a frame-like structure interlocked with the dielectric layer surface. The interlocked metal layer with the dielectric layer serves to reinforced dielectric layer structure. Accordingly, the reinforced dielectric layer is significantly less susceptible to cracks, delamination, and degradation associated with adverse environmental conditions thus allowing for improved packaging integrity and reliability over the lifetime of the semiconductor device.

Figure 1:
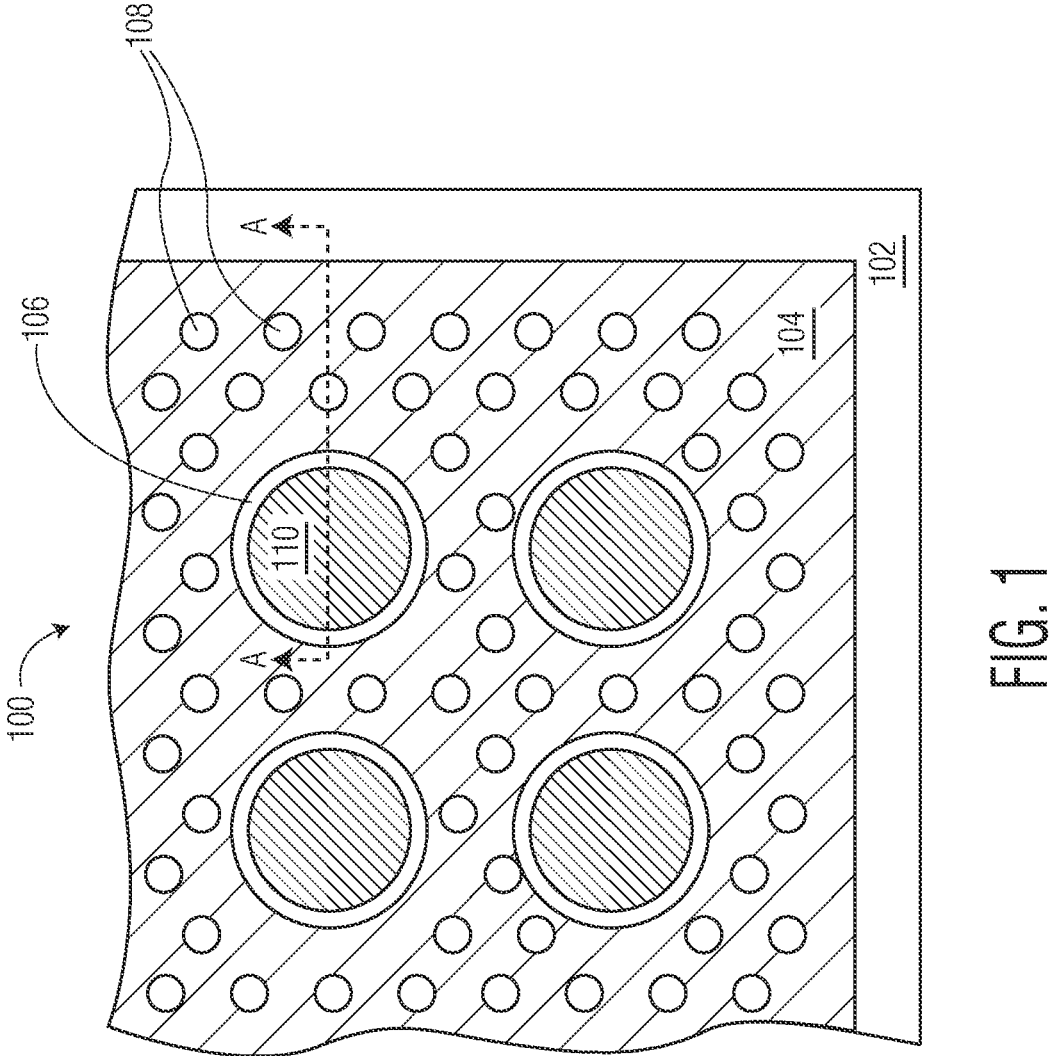
FIG. 1 illustrates, in a simplified plan view, an example semiconductor device having a reinforced dielectric structure in accordance with an embodiment.

FIG. 1 illustrates, in a simplified plan view, a portion of an example semiconductor device 100 having a reinforced dielectric structure in accordance with an embodiment. The device 100 includes an exposed portion of a final passivation layer 102 of a semiconductor die, a non-conductive layer formed over the final passivation layer 102, and a metal layer 104 formed over the non-conductive layer. In this embodiment, the metal layer 104 is patterned and etched to form plateau regions 106 and 108 exposed through the metal layer 104. The metal layer 104 is configured to reinforce the underlying non-conductive layer and seal the outer edge of the non-conductive layer at the final passivation layer 102 of the semiconductor die. In this embodiment, conductive connectors (e.g., solder balls) 110 are affixed to conductive under bump structures (not shown) formed over the semiconductor die. Detailed features of the device 100 such as a package encapsulant are not shown for illustration purposes. Even though the embodiment of FIG. 1 is depicted in a "fan-in" configuration, embodiments in other configurations (e.g., "fan-out") are anticipated by this disclosure. For example, in a fan-out configuration, the metal layer 104 is configured to reinforce the underlying non-conductive layer and seal the outer edge of the non-conductive layer at the package encapsulant. Cross-sectional views of the example semiconductor device 100 taken along line A-A of FIG. 1 at stages of manufacture are depicted in FIG. 2 through FIG. 10.

FIG. 2 through FIG. 10 illustrate, in simplified cross-sectional views, the example semiconductor device 100 taken along line A-A of FIG. 1 at various stages of manufacture in accordance with an embodiment.

Figure 2:
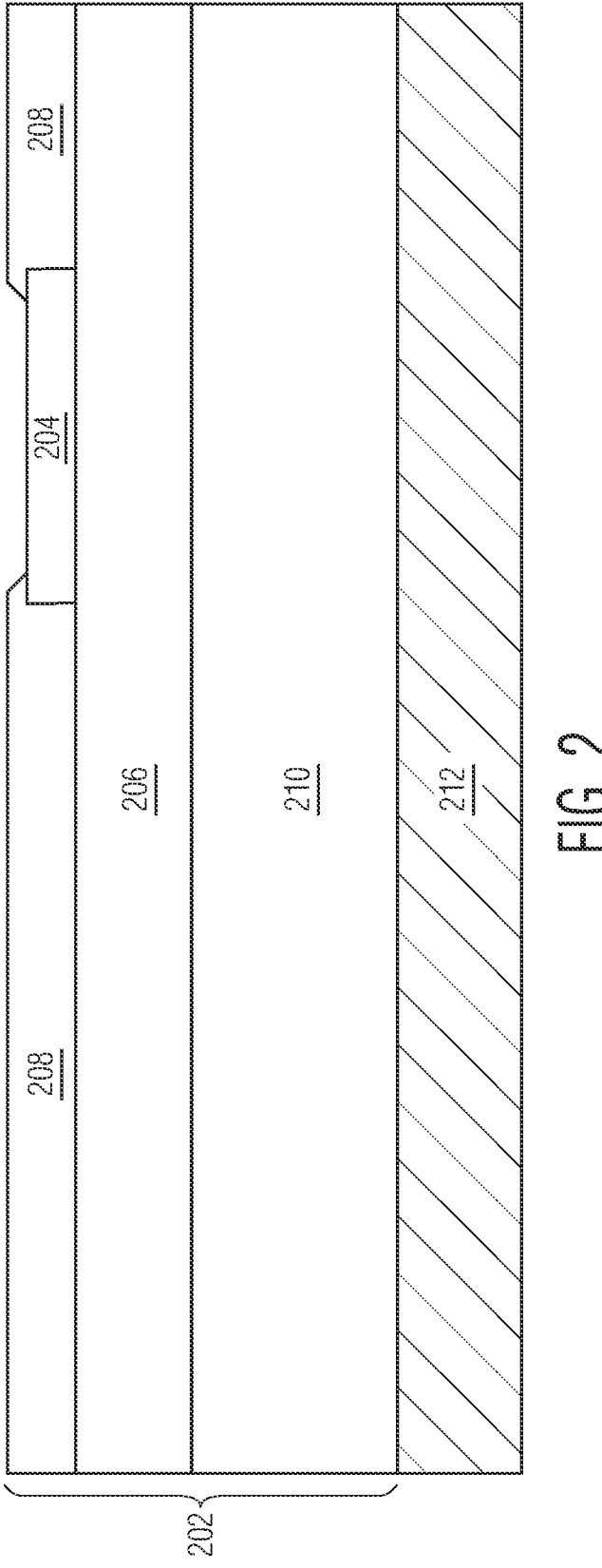
FIG. 2 through FIG. 10 illustrate, in simplified cross-sectional views, the example semiconductor device taken along line A-A of FIG. 1 at stages of manufacture in accordance with an embodiment.

FIG. 2 illustrates, in a simplified cross-sectional view, the example semiconductor device 100 at a stage of manufacture in accordance with an embodiment. At this stage of manufacture, a semiconductor die 202 is at least partially encapsulated with an encapsulant (e.g., epoxy molding compound) 212. In this embodiment, the semiconductor die 202 includes a substrate region (e.g., bulk) 210, an active region (e.g., circuitry, interconnect) 206 formed at an active side of the semiconductor die, a die pad 204 conductively connected to the circuitry and/or interconnect of the active region, and a final passivation layer 208 formed over the active side of the semiconductor die. In some embodiments, the semiconductor die 202 may be provided in a wafer form or portion of a wafer. The semiconductor die 202 may include any number of conductive interconnect layers and passivation layers. For illustration purposes, the die pad 204 at a top surface and the overlying final passivation layer 208 are depicted. In this embodiment, the final passivation layer 208 depicted in FIG. 2 corresponds to the final passivation layer 102 depicted in FIG. 1.

The semiconductor die 202 is configured and arranged in an active side up orientation. The die pad 204 at the active side is configured for connection to printed circuit board (PCB) by way of a redistribution layer, under-bump structure, and conductive connectors formed at subsequent stages, for example. The semiconductor die 202 may be formed from any suitable semiconductor material, such as silicon, germanium, gallium arsenide, gallium nitride, silicon nitride, silicon carbide, and the like. The semiconductor die 202 may further include any digital circuits, analog circuits, RF circuits, memory, processor, MEMS, sensors, the like, and combinations thereof.

Figure 3:
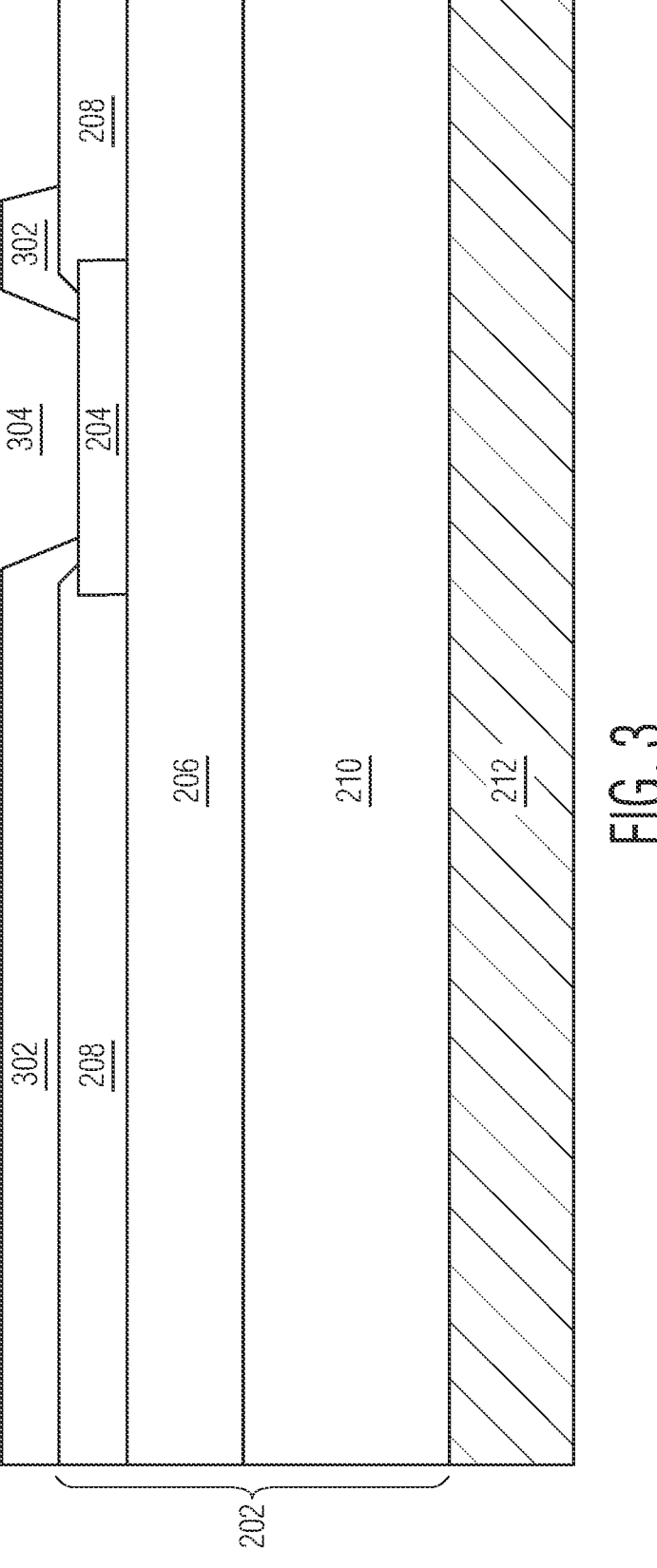

FIG. 3 illustrates, in a simplified cross-sectional view, the example semiconductor device 100 at a subsequent stage of manufacture in accordance with an embodiment. At this stage of manufacture, a first non-conductive (e.g., dielectric) layer 302 is formed over the semiconductor die 202. The non-conductive layer 302 is deposited or otherwise applied on the top surface of the semiconductor die 202. The non-conductive layer 302 may be formed from suitable non-conducting materials such as polybenzoxazole (PBO), polyimide, Ajinomoto build-up film (ABF), and epoxy molding compound, for example. An opening 304 is formed in the non-conductive layer 302. The opening 304 is formed through the non-conductive layer 302 and located over the die pad 204 such that a substantial portion of a top surface of the die pad 204 is exposed. The opening 304 may be formed using techniques such as laser drilling, or etching, for example. In this embodiment, an outer portion of the final passivation layer 208 near the outer edge of the semiconductor die 202 remains exposed (e.g., not covered with the non-conductive layer 302).

Figure 4:
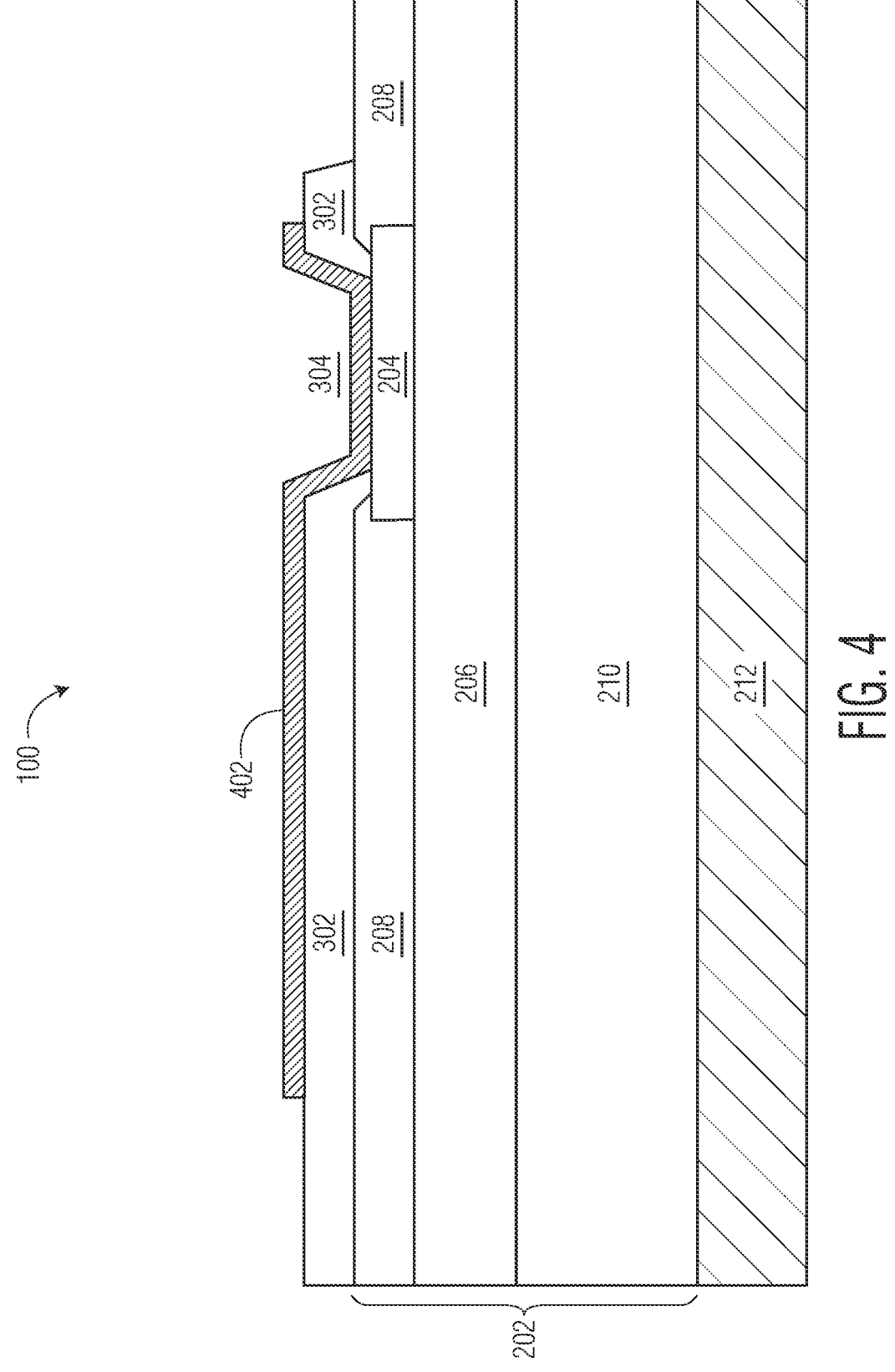

FIG. 4 illustrates, in a simplified cross-sectional view, the example semiconductor device 100 at a subsequent stage of manufacture in accordance with an embodiment. At this stage of manufacture, a conductive redistribution layer (RDL) 402 is formed over the non-conductive layer 302 and exposed portion of the die pad 204. The term "conductive," as used herein, generally refers to electrical conductivity unless otherwise specified. The RDL 402 may be formed by depositing a relatively thin seed layer (not shown), patterning, and utilizing the seed layer in a metal (e.g., copper) plating process, for example. The RDL 402 forms a conformal conductive layer on the exposed die pad 204 in the opening 304 and portions of the non-conductive 302 layer. The RDL 402 is conductively connected to the die pad 204 and configured to interconnect the die pad 204 with an under-bump structure formed at a subsequent stage, for example.

Figure 5:
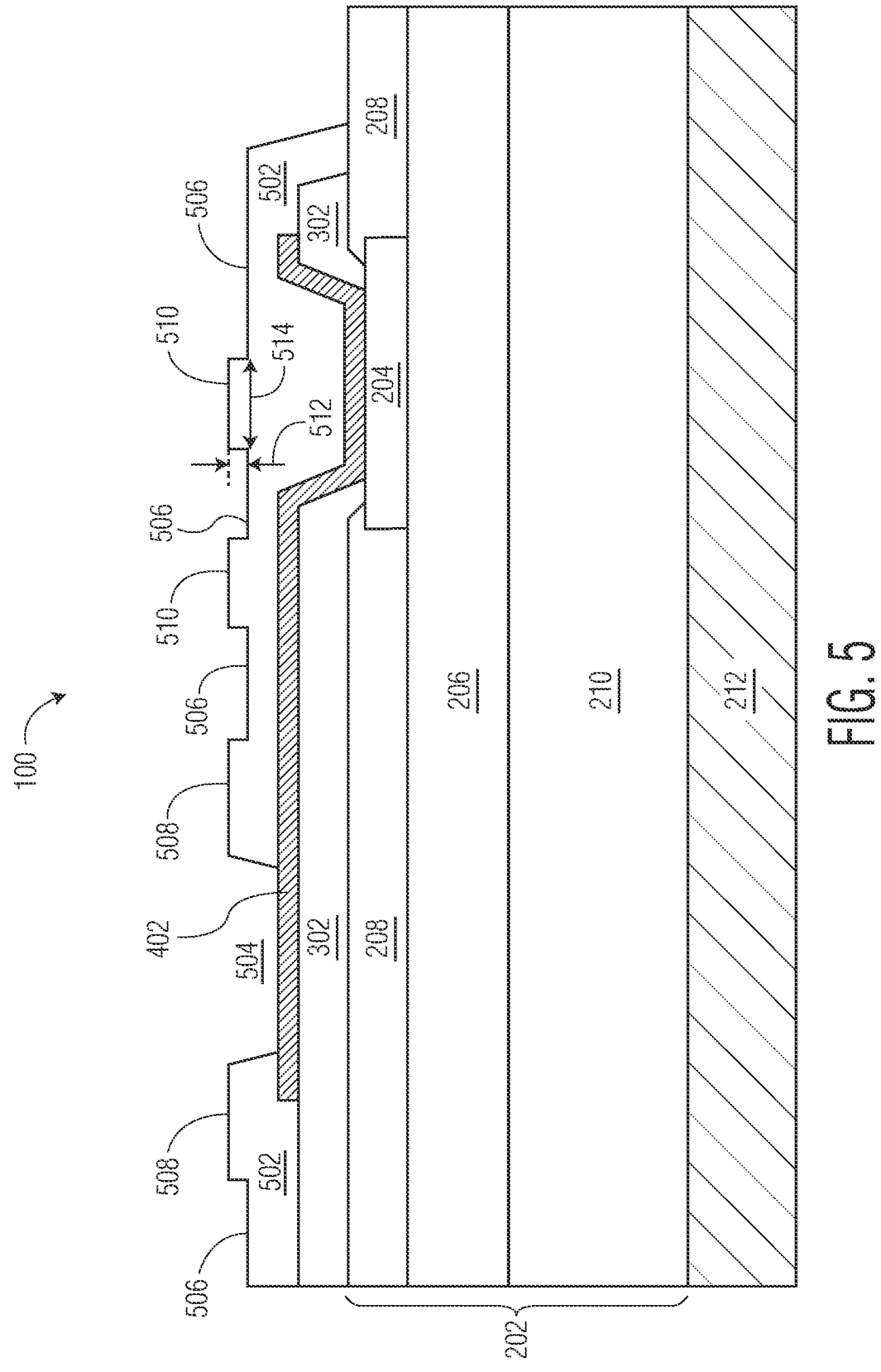

FIG. 5 illustrates, in a simplified cross-sectional view, the example semiconductor device 100 at a subsequent stage of manufacture in accordance with an embodiment. At this stage of manufacture, a second non-conductive (e.g., dielectric) layer 502 is formed over the RDL 402 and the first non-conductive layer 302. The non-conductive layer 502 is deposited or otherwise applied on the RDL 402 and the exposed top surface of the non-conductive layer 302. The non-conductive layer 502 may be formed from suitable non-conducting materials such as PBO, polyimide, ABF, and epoxy molding compound, for example. In this embodiment, non-conductive layer 502 may be characterized as a photo-imageable polymer material (e.g., photosensitive solder mask material) layer. An opening 504 and a shallow etched cavity region 506 are patterned and formed in the non-conductive layer 502. The opening 504 may be formed using traditional masking and exposure techniques and the cavity region 506 may be formed using known gray-scale masking and lensing exposure techniques to limit the depth of the cavity region, for example. In this embodiment, the opening 504 and the cavity region 506 are patterned (e.g., masking, exposure) and etched during a same process operation. In other embodiments, the opening 504 may be formed in a process operation different from that of the cavity region 506 formation.

The opening 504 is formed through the non-conductive layer 502 and located over a portion of the RDL 402 such that a portion of a top surface of the RDL 402 is exposed through the opening. The cavity region 506 is formed as a shallow etched region at a top surface of the non-conductive layer 502 and configured to form a plurality of plateau regions 508 and 510. A portion of the non-conductive layer 502 remains between the bottom surface of the cavity region 506 and a bottom surface of the non-conductive layer 502. The cavity region 506 is configured to have a predetermined depth dimension 512 measured from the top surface of the plateau regions 508 and 510 to the bottom surface of the cavity region 506. In this embodiment, the predetermined depth dimension 512 is approximately in a range of 0.1 microns to 0.5 microns. The plateau regions 508 and 510 correspond to the respective plateau regions 106 and 108 depicted in FIG. 1. For example, the plateau region 508 is formed as a donut shape that substantially surrounds the opening 504. In this embodiment, the plateau regions 510 are formed having a substantially round shape with a predetermined width (e.g., diameter) dimension 514 in a range of 5 microns to 50 microns. In other embodiments, the plateau regions 510 may be formed having other shapes and/or width dimensions. In this embodiment, an outer portion of the non-conductive layer 502 extends toward the outer perimeter of the semiconductor die and is configured to seal (e.g., enclose) an outer edge of the non-conductive layer 302 leaving an outer portion of the final passivation layer 208 exposed (e.g., not covered with the non-conductive layers 302 and 502) near the outer edge of the semiconductor die 202.

Figure 6:
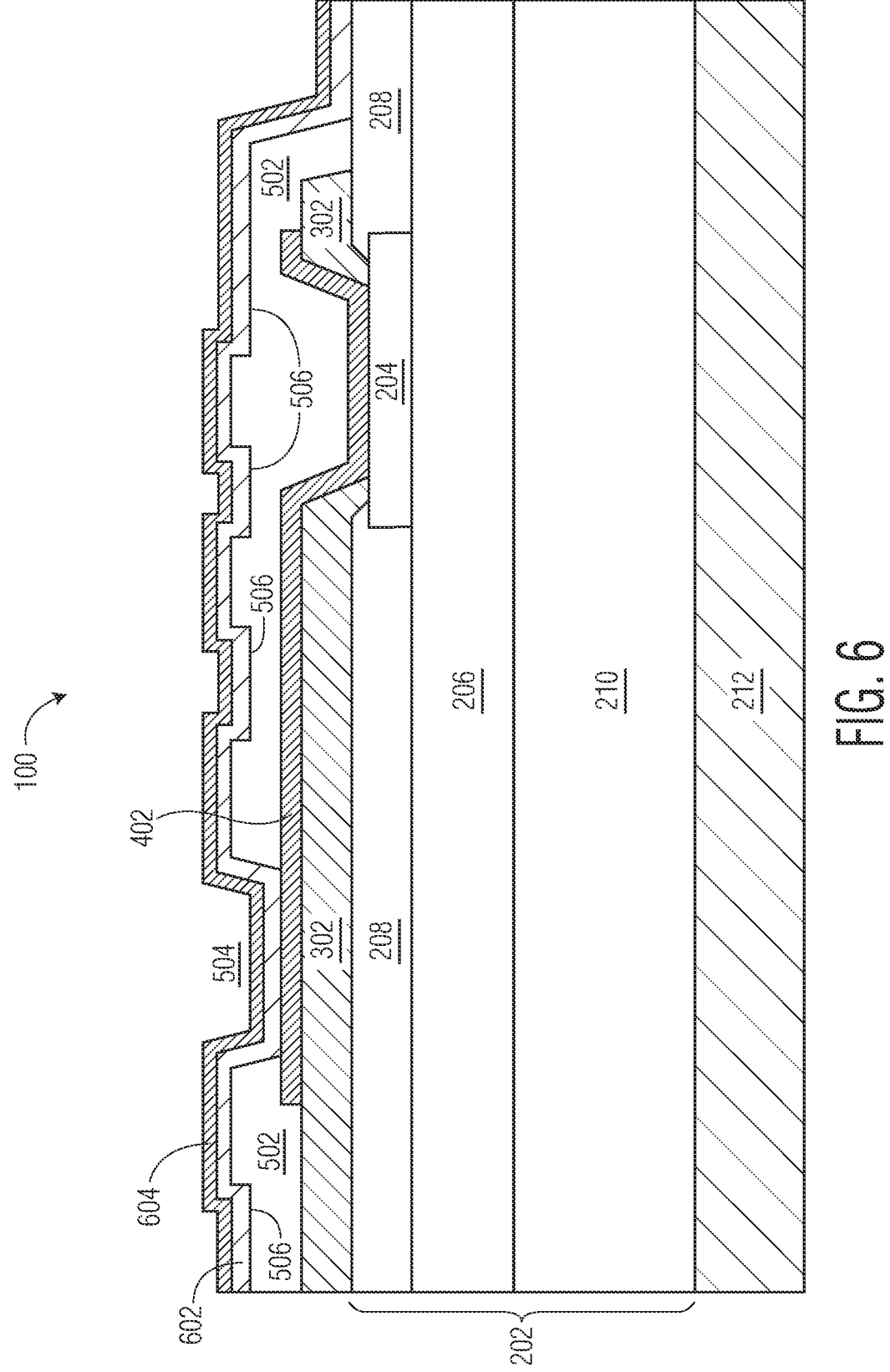

FIG. 6 illustrates, in a simplified cross-sectional view, the example semiconductor device 100 at a subsequent stage of manufacture in accordance with an embodiment. At this stage of manufacture, a metal layer 602 and a seed layer 604 are formed over the patterned and etched non-conductive layer 502 and exposed portion of the RDL 402 in the opening 504. In this embodiment, the metal layer 602 is characterized as anti-oxidation, corrosion resistant, high rigidity metal such as titanium, nickel-vanadium, zirconium, stainless steel, and alloys thereof. The metal layer 602 may be formed by sputtering, deposited, or otherwise applied over the non-conductive layer 502 and exposed portion of the RDL 402. The metal layer 602 is formed to have thickness sufficient to at least substantially fill the cavity region 506 of the non-conductive layer 502. The seed layer 604 is formed as a relatively thin layer and may include copper, tungsten, palladium, or suitable alloys thereof conducive for plating at a subsequent stage of manufacture, for example.

Figure 7:
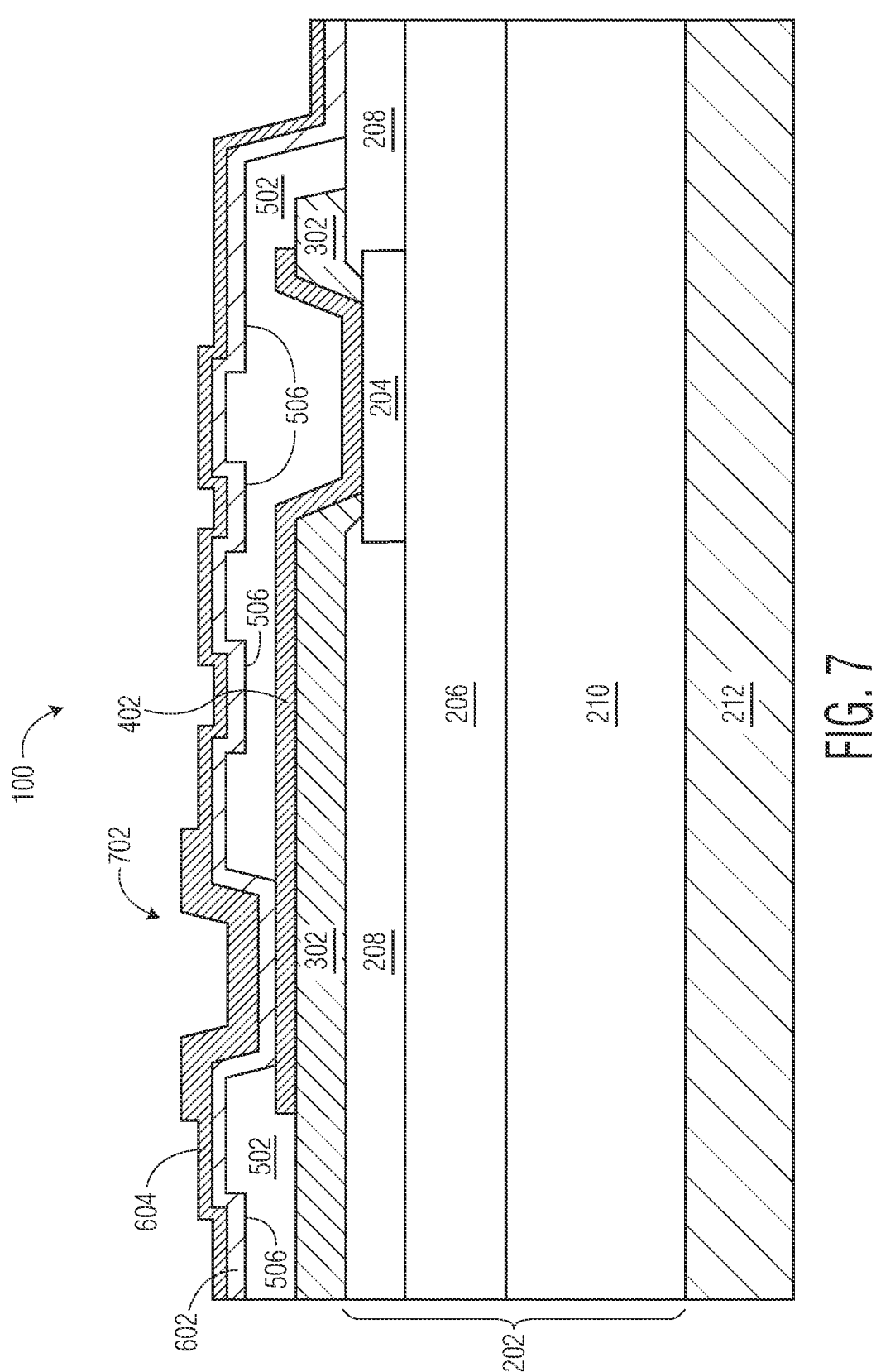

FIG. 7 illustrates, in a simplified cross-sectional view, the example semiconductor device 100 at a subsequent stage of manufacture in accordance with an embodiment. At this stage of manufacture, a conductive under-bump metallization (UBM) 702 is formed on the seed layer 604. In this embodiment, the UBM 702 includes copper and is formed by utilizing the seed layer 604 in a copper plating operation. The copper plating operation may be characterized as an electroless process or an electroplating process. The UBM 702 forms a conformal conductive layer over the exposed pad region and sidewalls of the cavity 504 (FIG. 6). The UBM 702 is patterned and configured to interconnect the die pad 204 by way of the RDL 402. In other embodiments, the UBM 702 may be formed by plating other metal materials.

Figure 8:
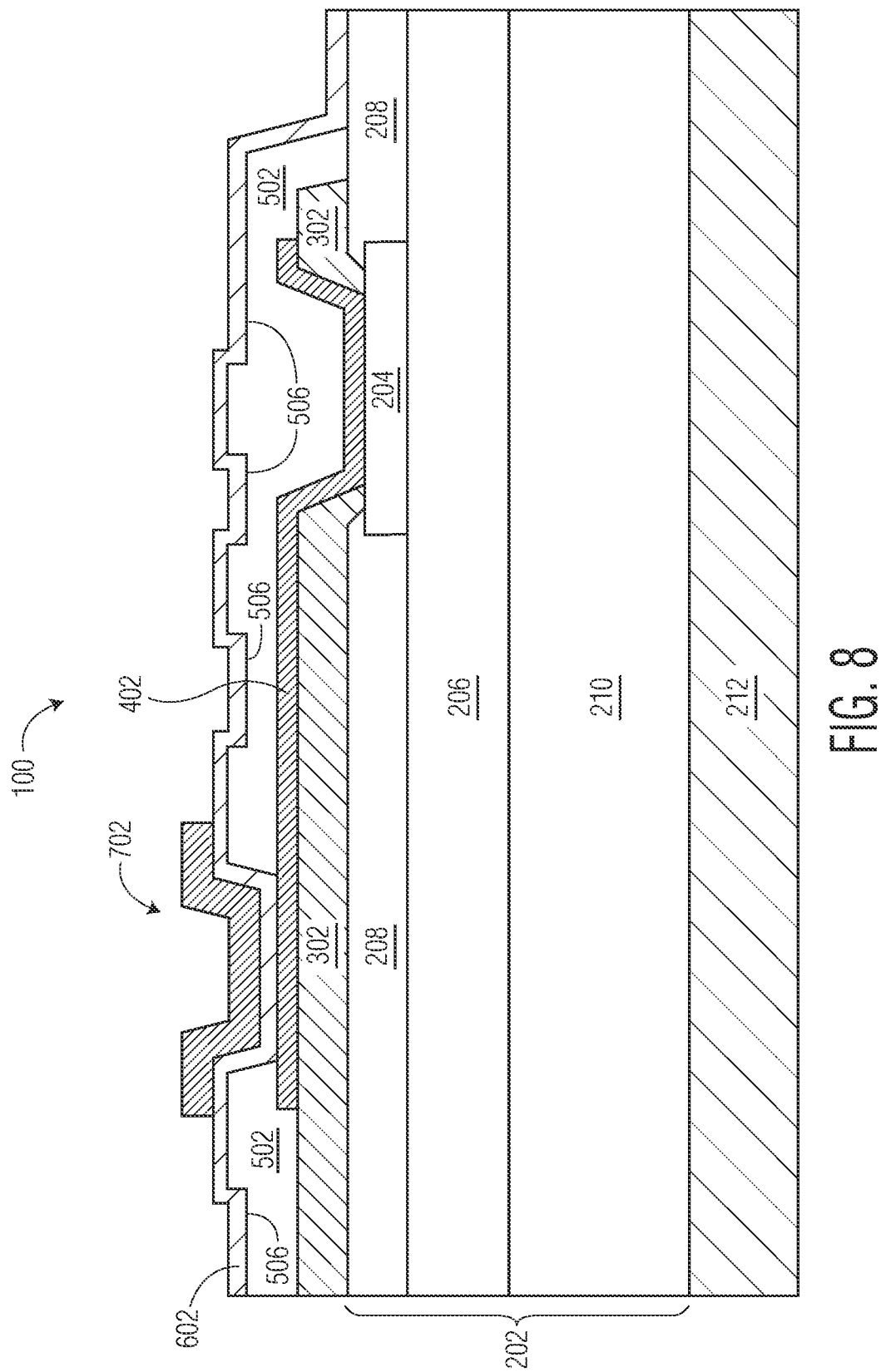

FIG. 8 illustrates, in a simplified cross-sectional view, the example semiconductor device 100 at a subsequent stage of manufacture in accordance with an embodiment. At this stage of manufacture, the seed layer 604 is removed. After the plating operation to form the UBM 702 is completed, the remaining exposed portions of the seed layer 604 is etched and removed. In this embodiment, portions of the metal layer 602 underlying the seed layer 604 are exposed by way of removing the remaining exposed portions of the seed layer 604.

Figure 9:
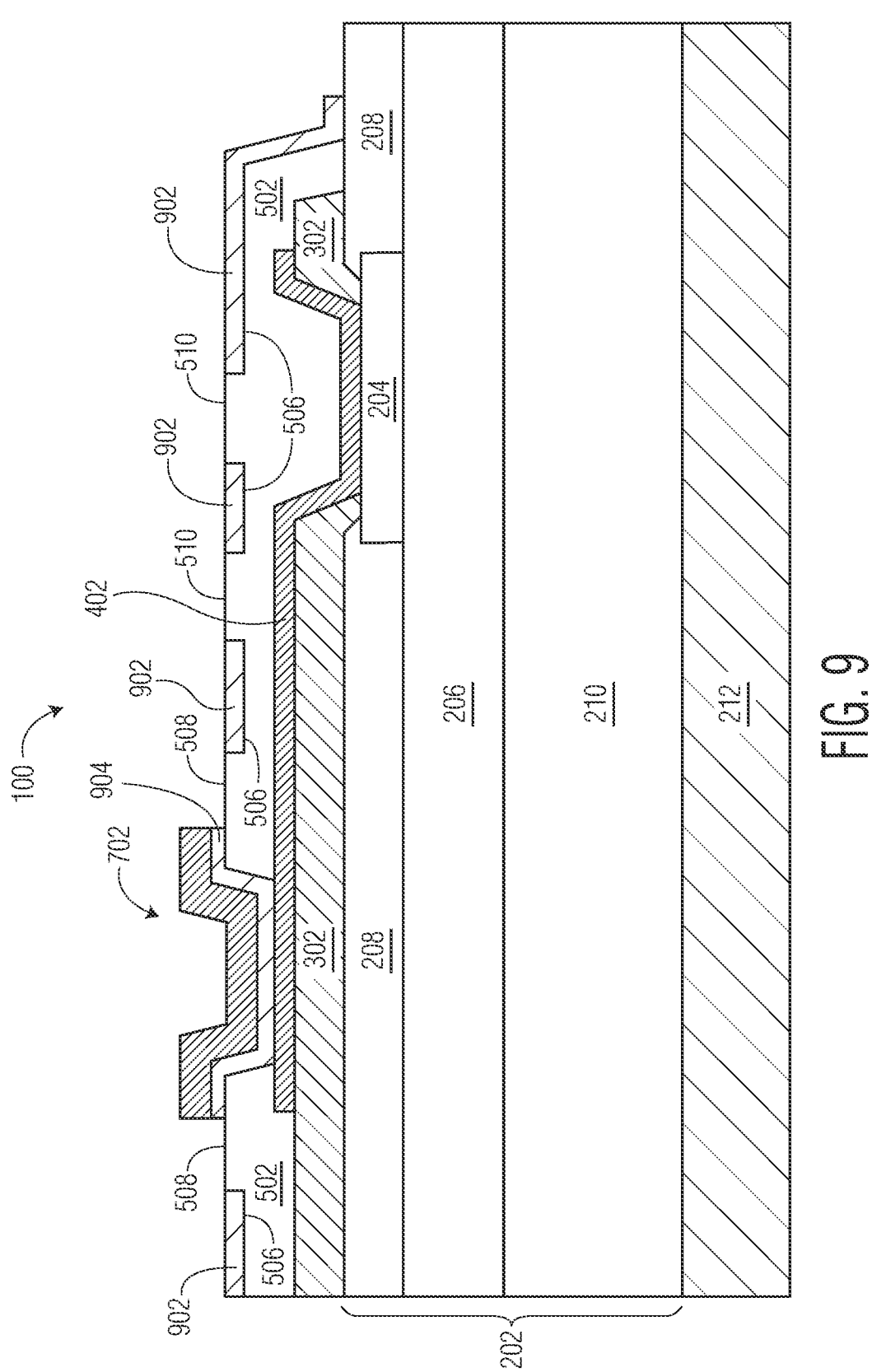

FIG. 9 illustrates, in a simplified cross-sectional view, the example semiconductor device 100 at a subsequent stage of manufacture in accordance with an embodiment. At this stage of manufacture, exposed portions of the metal layer (602) are etched to reveal top surfaces of the respective plateau regions 508 and 510 of the non-conductive layer 502. In this embodiment, the plateau regions 508 and 510 of the non-conductive layer 502 depicted in FIG. 9 corresponds to the plurality of plateau regions 106 and 108 depicted in FIG. 1.

The etched metal layer (602) leaves a first metal layer portion 902 substantially filled in the cavity region 506 and a second metal layer portion 904 disposed between the UBM 702 and the RDL 402. In this embodiment, a top surface of the metal layer portion 902 is substantially coplanar with the top surface of the plateau regions 508 and 510. The metal layer portion 902 is configured to substantially reinforce the underlying non-conductive layers 502 and 302. With the plateau regions 508 and 510 exposed, the metal layer portion 902 is essentially interlocked with the non-conductive layer 502 and thus adding rigidity to the non-conductive layer 502. The metal layer portion 902 is further configured to seal the outer perimeter of the non-conductive layer 502. The adhesion properties of the metal layer portion 902 minimizes potential delamination associated with extreme environmental conditions (e.g., temperature, moisture, corrosion). In this embodiment, the plateau regions 508 and 510 of the non-conductive layer 502 depicted in FIG. 9 corresponds to the plurality of plateau regions 106 and 108 depicted in FIG. 1.

Figure 10:
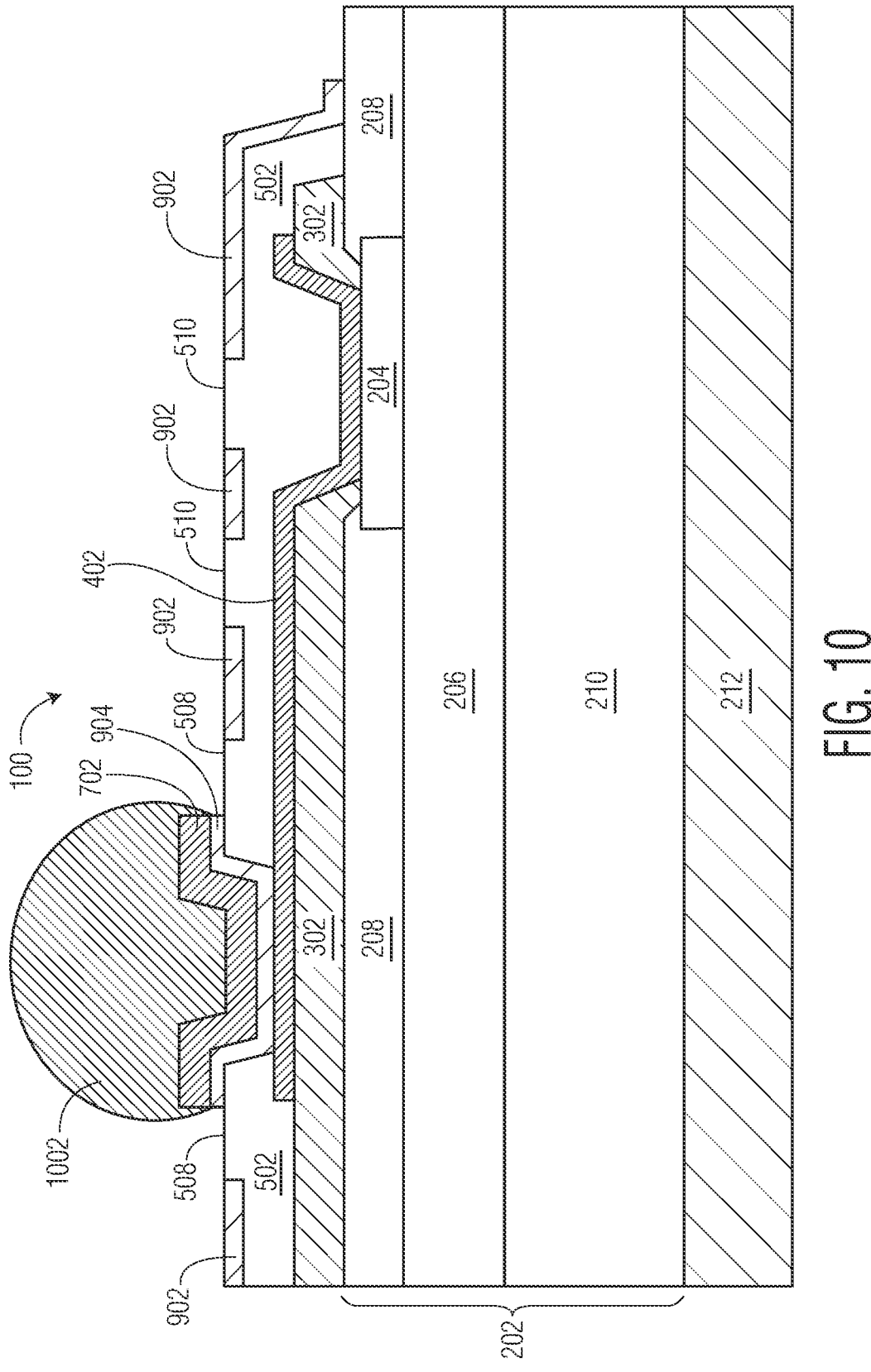

FIG. 10 illustrates, in a simplified cross-sectional view, the example semiconductor device 100 at a subsequent stage of manufacture in accordance with an embodiment. At this stage of manufacture, a conductive connector 1002 (e.g., solder ball) is attached to UBM 702. The conductive connector 1002 is placed onto the UBM 702 and reflowed, for example. A flux material may be placed in the UBM 702 before placing the conductive connector 1002 onto the UBM 702 to improve wetting and adhesion. In this embodiment, the conductive connector 1002 is formed as a solder ball. In other embodiments, the conductive connector 1002 may be formed as a solder bump, gold stud, copper pillar, or the like. In this embodiment, the conductive connector 1002 depicted in FIG. 10 corresponds to the conductive connectors 110 depicted in FIG. 1.

Generally, there is provided, a method including forming a redistribution layer (RDL) over a semiconductor die, a portion of the RDL contacting a die pad of the semiconductor die; depositing a non-conductive layer over the RDL; forming an opening in the non-conductive layer, the opening exposing a portion of the RDL; forming a plurality of plateau regions in the non-conductive layer, a cavity region in the non-conductive layer separating each plateau region of the plurality of plateau regions; depositing a metal layer over the non-conductive layer and exposed portion of the RDL; and etching the metal layer to expose the plurality of plateau regions through the metal layer, the cavity region remaining substantially filled by a first portion of the metal layer. The cavity region in the non-conductive layer may be formed having a depth dimension in a range of 0.1 microns to 0.5 microns measured from a top surface of the plurality of plateau regions. Forming the plurality of plateau regions may include a first plateau region formed substantially surrounding the opening. The method may further include forming an under-bump metal (UBM) in the opening, a second portion of the metal layer located between the UBM and the RDL. The method may further include depositing a seed layer over the metal layer before forming the UBM, the UBM formed by way of electroplating a copper material. An outer portion of the metal layer may extend toward an outer perimeter of the semiconductor die and seal an outer edge of the non-conductive layer. After etching the metal layer to expose the plurality of plateau regions, a top surface of the plurality of plateau regions may be substantially coplanar with a top surface of the first portion of the metal layer. The metal layer may include titanium, nickel, zirconium, or stainless steel. The non-conductive layer may include polybenzoxazole (PBO), polyimide, Ajinomoto build-up film (ABF), or epoxy molding compound.

In another embodiment, there is provided, a semiconductor device including a semiconductor die having a die pad; a redistribution layer (RDL) formed over the semiconductor die, a portion of the RDL connected the die pad; a non-conductive layer formed over the RDL; an opening formed in the non-conductive layer, the opening exposing a portion of the RDL; a plurality of plateau regions formed in the non-conductive layer, a cavity region in the non-conductive layer separates each plateau region of the plurality of plateau regions; and a metal layer formed over the non-conductive layer and exposed portion of the RDL, the plurality of plateau regions exposed through the non-conductive layer, and the metal layer substantially filling the cavity region. The cavity region in the non-conductive layer may be formed having a depth dimension of less than one micron measured from a top surface of the plurality of plateau regions. The plurality of plateau regions may include a first plateau region substantially surrounding the opening. The semiconductor device may further include an under-bump metal (UBM) formed in the opening, a portion of the metal layer located between the UBM and the RDL. An outer portion of the metal layer may extend toward an outer perimeter of the semiconductor die and seal an outer edge of the non-conductive layer. A top surface of the plurality of plateau regions may be substantially coplanar with a top surface of the metal layer in the cavity region.

In yet another embodiment, there is provided, a method including depositing a first non-conductive layer over a semiconductor die; forming a first opening in the first non-conductive layer, the first opening exposing a portion of a die pad of the semiconductor die; forming a redistribution layer (RDL) over the first non-conductive layer, a portion of the RDL contacting the exposed portion of the die pad; depositing a second non-conductive layer over the RDL; forming a second opening in the second non-conductive layer, the second opening exposing a portion of the RDL; forming a plurality of plateau regions in the second non-conductive layer, a cavity region in the second non-conductive layer separating each plateau region of the plurality of plateau regions; depositing a metal layer over the second non-conductive layer and exposed portion of the RDL; and etching the metal layer to expose the plurality of plateau regions through the metal layer, the cavity region remaining substantially filled by a first portion of the metal layer. The method may further include forming an under-bump metal (UBM) in the second opening, a second portion of the metal layer located between the UBM and the RDL. The steps of forming the second opening and forming the plurality of plateau regions may occur during a same etch operation. The cavity region in the second non-conductive layer may be formed having a depth dimension in a range of 0.1 microns to 0.5 microns measured from a top surface of the plurality of plateau regions. Forming the plurality of plateau regions may include a first plateau region formed substantially surrounding the second opening.

By now, it should be appreciated that there has been provided semiconductor device packaging with a reinforced dielectric structure. The semiconductor device packaging includes a redistribution layer formed over a semiconductor die and connected to die pads of the semiconductor die. A dielectric layer (e.g., top non-conductive layer) is formed over the redistribution layer. A plurality of openings is formed in the dielectric layer to expose respective portions of the underlying redistribution layer. The openings in the dielectric layer and corresponding exposed portions of the redistribution layer are configured for under-bump metallization structures formed at a subsequent stage of manufacturing. A shallow-etched cavity region is etched into a top surface of the dielectric layer such that a plurality of plateau regions of the dielectric layer are formed. Each plateau region of the plurality of the plateau regions is separated from one another by way of the cavity region. A metal layer is formed over the dielectric layer and exposed portions of the redistribution layer. Exposed portions of the metal layer are etched at a subsequent stage of manufacturing to expose top surfaces of the plurality of plateau regions. In this manner, the etched metal layer provides a frame-like structure interlocked with the dielectric layer surface. The interlocked metal layer with the dielectric layer serves to reinforced dielectric layer structure. Accordingly, the reinforced dielectric layer is significantly less susceptible to cracks, delamination, and degradation associated with adverse environmental conditions thus allowing for improved packaging integrity and reliability over the lifetime of the semiconductor device.

The terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method comprising:
forming a redistribution layer (RDL) over a semiconductor die, a portion of the RDL contacting a die pad of the semiconductor die;
depositing a non-conductive layer over the RDL;
forming an opening in the non-conductive layer, the opening exposing a portion of the RDL;
forming a plurality of plateau regions in the non-conductive layer, a cavity region in the non-conductive layer separating each plateau region of the plurality of plateau regions, the cavity region including a shallow trench extending less than a full thickness of the non-conductive layer;
depositing a metal layer over the non-conductive layer and exposed portion of the RDL; and
etching the metal layer to expose the plurality of plateau regions through the metal layer, the cavity region remaining substantially filled by a first portion of the metal layer.

2. The method of claim 1, wherein the cavity region in the non-conductive layer is formed having a depth dimension in a range of 0.1 microns to 0.5 microns measured from a top surface of the plurality of plateau regions.

3. The method of claim 1, wherein forming the plurality of plateau regions includes a first plateau region formed substantially surrounding the opening.

4. The method of claim 1, further comprising forming an under-bump metal (UBM) in the opening, a second portion of the metal layer located between the UBM and the RDL.

5. The method of claim 4, further comprising depositing a seed layer over the metal layer before forming the UBM, the UBM formed by way of electroplating a copper material.

6. The method of claim 1, wherein an outer portion of the metal layer extends toward an outer perimeter of the semiconductor die and seals an outer edge of the non-conductive layer.

7. The method of claim 1, wherein after etching the metal layer to expose the plurality of plateau regions, a top surface of the plurality of plateau regions is substantially coplanar with a top surface of the first portion of the metal layer.

8. The method of claim 1, wherein the metal layer comprises titanium, nickel, zirconium, or stainless steel.

9. The method of claim 1, wherein the non-conductive layer comprises polybenzoxazole (PBO), polyimide, Ajinomoto build-up film (ABF), or epoxy molding compound.

10. A semiconductor device comprising:
a semiconductor die having a die pad;
a redistribution layer (RDL) formed over the semiconductor die, a portion of the RDL connected the die pad;
a non-conductive layer formed over the RDL;
an opening formed in the non-conductive layer, the opening exposing a portion of the RDL;
a plurality of plateau regions formed in the non-conductive layer, a cavity region in the non-conductive layer separates each plateau region of the plurality of plateau regions, the cavity region extending less than a full thickness of the non-conductive layer; and
a metal layer formed over the non-conductive layer and exposed portion of the RDL, the plurality of plateau regions exposed through the non-conductive layer, and the metal layer substantially filling the cavity region.

11. The semiconductor device of claim 10, wherein the cavity region in the non-conductive layer is formed having a depth dimension of less than one micron measured from a top surface of the plurality of plateau regions.

12. The semiconductor device of claim 10, wherein the plurality of plateau regions includes a first plateau region substantially surrounding the opening.

13. The semiconductor device of claim 10, further comprising an under-bump metal (UBM) formed in the opening, a portion of the metal layer located between the UBM and the RDL.

14. The semiconductor device of claim 10, wherein an outer portion of the metal layer extends toward an outer perimeter of the semiconductor die and seals an outer edge of the non-conductive layer.

15. The semiconductor device of claim 10, wherein a top surface of the plurality of plateau regions is substantially coplanar with a top surface of the metal layer in the cavity region.

16. A method comprising:

depositing a first non-conductive layer over a semiconductor die;

forming a first opening in the first non-conductive layer, the first opening exposing a portion of a die pad of the semiconductor die;

forming a redistribution layer (RDL) over the first non-conductive layer, a portion of the RDL contacting the exposed portion of the die pad;

depositing a second non-conductive layer over the RDL;

forming a second opening in the second non-conductive layer, the second opening exposing a portion of the RDL;

forming a plurality of plateau regions in the second non-conductive layer, a cavity region in and extending less than a thickness of the second non-conductive layer separating each plateau region of the plurality of plateau regions;

depositing a metal layer over the second non-conductive layer and exposed portion of the RDL; and etching the metal layer to expose the plurality of plateau regions through the metal layer, the cavity region remaining substantially filled by a first portion of the metal layer.

17. The method of claim 16, further comprising forming an under-bump metal (UBM) in the second opening, a second portion of the metal layer located between the UBM and the RDL.

18. The method of claim 16, wherein the steps of forming the second opening and forming the plurality of plateau regions occur during a same etch operation.

19. The method of claim 16, wherein the cavity region in the second non-conductive layer is formed having a depth dimension in a range of 0.1 microns to 0.5 microns measured from a top surface of the plurality of plateau regions.

20. The method of claim 16, wherein forming the plurality of plateau regions includes a first plateau region formed substantially surrounding the second opening.

* * * * *